United States Patent
Cho

(10) Patent No.: US 7,416,603 B2
(45) Date of Patent: *Aug. 26, 2008

(54) HIGH QUALITY SINGLE CRYSTAL AND METHOD OF GROWING THE SAME

(75) Inventor: Hyon-Jong Cho, Gumi-si (KR)

(73) Assignee: Siltron Inc., Gyeongsangbuk-Do (KR)

(*) Notice: Subject to any disclaimer, the term of this patent is extended or adjusted under 35 U.S.C. 154(b) by 194 days.

This patent is subject to a terminal disclaimer.

(21) Appl. No.: 11/254,245

(22) Filed: Oct. 19, 2005

(65) Prior Publication Data
US 2006/0096526 A1    May 11, 2006

(30) Foreign Application Priority Data

Oct. 19, 2004  (KR) .................. 10-2004-0083447
Nov. 29, 2004  (KR) .................. 10-2004-0098530

(51) Int. Cl.
*C30B 15/20* (2006.01)

(52) U.S. Cl. .................. 117/13; 117/30; 117/32; 117/217

(58) Field of Classification Search .................. 117/13, 117/30, 32, 217; 423/328.2
See application file for complete search history.

(56) References Cited

U.S. PATENT DOCUMENTS

| | | | | |
|---|---|---|---|---|
| 5,938,836 A | * | 8/1999 | Tomioka et al. | 117/30 |
| 6,592,662 B2 | * | 7/2003 | Fusegawa et al. | 117/13 |

* cited by examiner

*Primary Examiner*—Felisa Hiteshew
(74) *Attorney, Agent, or Firm*—Grossman, Tucker, Perreault & Pfleger, PLLC

(57) ABSTRACT

Disclosed is a method of growing a single crystal from a melt contained in a crucible. The method includes the step of making the temperature of a melt increase gradually to a maximum point and then decrease gradually along the axis parallel to the lengthwise direction of the single crystal from the interface of the single crystal and the melt to the bottom of the crucible. The increasing temperature of the melt is kept to preferably have a greater temperature gradient than the decreasing temperature thereof. Preferably, the axis is set to pass through the center of the single crystal. Preferably, the convection of the inner region of the melt is made smaller than that of the outer region thereof.

11 Claims, 7 Drawing Sheets

HIGH QUALITY SINGLE CRYSTAL AND METHOD OF GROWING THE SAME

BACKGROUND OF THE INVENTION

1. Field of the Invention

The present invention relates to a method of growing a single crystal, and more particularly to a method of growing a high quality single crystal from a melt by controlling the temperature distribution of the melt.

2. Description of the Related Art

Conventionally, there has been controlled the temperature distribution of the solid crystal in order to obtain a high quality single crystal, which enables to increase the yield rate of electronic devices such as semiconductor. This is to control the stress induced by the contraction resulting from cooling after crystallization, or the behavior of the point defects generated during cooling.

Briefly introducing such conventional art for controlling the temperature distribution of the solid crystal in order to obtain a high quality single crystal, Korean Patent Application No. 2000-0013028 discloses a means for controlling the temperature distribution of a GaAs single crystal grown to resolve the thermal stresses formed therein, and Japanese Patent Application No. Pyoung-2-119891 discloses hot zones employed to reduce lattice defects of a silicon single crystal during the cooling process. Further, Japanese Patent Application No. Pyoung-7-158458 discloses a means for controlling both the temperature distribution and the pulling rate of a single crystal being grown, and Japanese Patent Application No. Pyoung-7-66074 discloses a method of resolving the defect density of a single crystal by improving the hot zones and controlling the cooling rate. Korean Patent Application No. 1999-7009309 (USSN. 60/041,845) also discloses a means for restraining the formation of the defects by changing the hot zones and controlling the cooling rate. In addition, Korean Patent Application No. 2002-0021524 has proposed an improvement in the thermal shield and water-cooled tubes to increase the yield rate of high quality single crystals.

However, such conventional technologies are based on reactions in the solid phase, thus suffering the following problems. First, although Korean Patent Application No. 1999-7009309 (USSN. 60/041,845) is intended to reduce the supersaturated point defects leading to the crystal defects by means of diffusion process, it is impossible to be applied for practical applications because the processing time taken for maintaining the temperature at a proper level is too long, i.e., about 16 hours or more.

Second, the invention based on the theory of the reactions in the solid phase cannot provide for large-scale production. For example, although Korean Patent Application No. 2001-7006403 has proposed an improvement in the thermal shield and water-cooled tubes, the pulling rate is only 0.4 mm/min that is too low to yield high quality single crystals at high productivity.

There has been proposed another conventional technology for achieving a high quality single crystal, which is to control the solid-liquid interface (crystal growing interface). For example, Japanese Patent Application No. Pyoung-4-173474 and Korean Patent Application No. 1993-0001240 describes a method of controlling the solid-liquid interface for obtaining a compound single crystal of high quality such as GaAs, and Korean Patent Application No. 1998-026790 and U.S. Pat. No. 6,458,204 defines the form of the solid-liquid interface to achieve a silicon single crystal of high quality. Nevertheless, even according to Korean Patent Application No. 1999-7009309 involving such form of solid-liquid interface, it is impossible to obtain a high quality single crystal. Thus, such conventional technologies cannot sufficiently provide for the productivity of high quality single crystals.

SUMMARY OF THE INVENTION

It is an object of the present invention to provide a method of preparing a high quality single crystal by resolving such conventional problems.

It is another object of the present invention to provide a method of growing a high quality single crystal at high productivity.

It is a further object of the present invention to effectively restrain the generation of the point defects in a single crystal grown.

According to an embodiment of the present invention, there is provided a method of growing a single crystal from a melt contained in a crucible, which comprises the step of making the temperature of a melt increase gradually to a maximum point and then decrease gradually along the axis parallel to the lengthwise direction of the single crystal from the crystal-melt interface to the bottom of the crucible, wherein the increasing temperature of the melt is kept to have a greater temperature gradient than the decreasing temperature thereof. Preferably, the axis is set to pass through the center of the single crystal. Preferably, the convection of the inner region of the melt is made smaller than that of the outer region thereof.

The inventive method of growing a single crystal involves Czochralski method, modified Czochralski method, top-seed solution growth method, floating zone method, or Bridgman method. The single crystal may be a single element such as Si and Ge, or a compound such as GaAs, Inp, LN($LiNbO_3$), LT($LiTaO_3$), YAG(Yttrium Aluminum Garnet), LBO ($LiB_3O_5$), and CLBO($CsLiB_6O_{10}$).

According to one aspect of the present invention, there is also provided a single crystal, which has been grown from a melt in such a condition that the temperature of the melt increases gradually to a maximum point and then decreases gradually along the axis parallel to the lengthwise direction of the single crystal from the interface of the single crystal and the melt to the bottom of the crucible, the increasing temperature of the melt being kept to have a greater temperature gradient than the decreasing temperature thereof.

The present invention will now be described more specifically with reference to the drawings attached only by way of example.

BRIEF DESCRIPTION OF THE ATTACHED DRAWINGS

Figure 5:
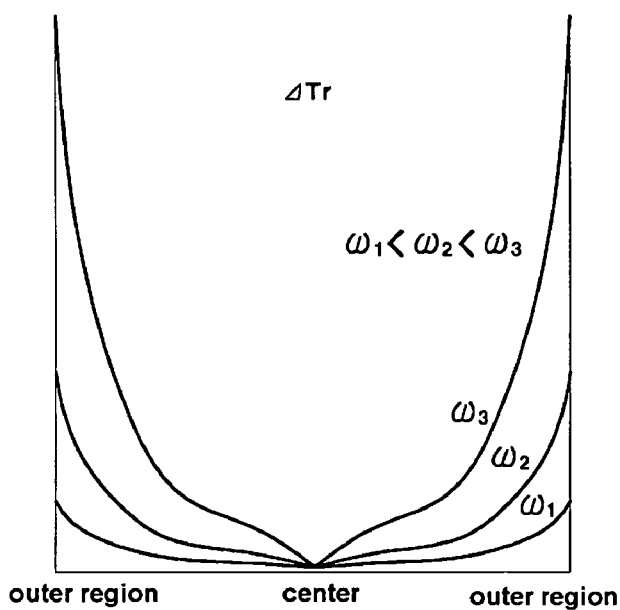
Figure 6:
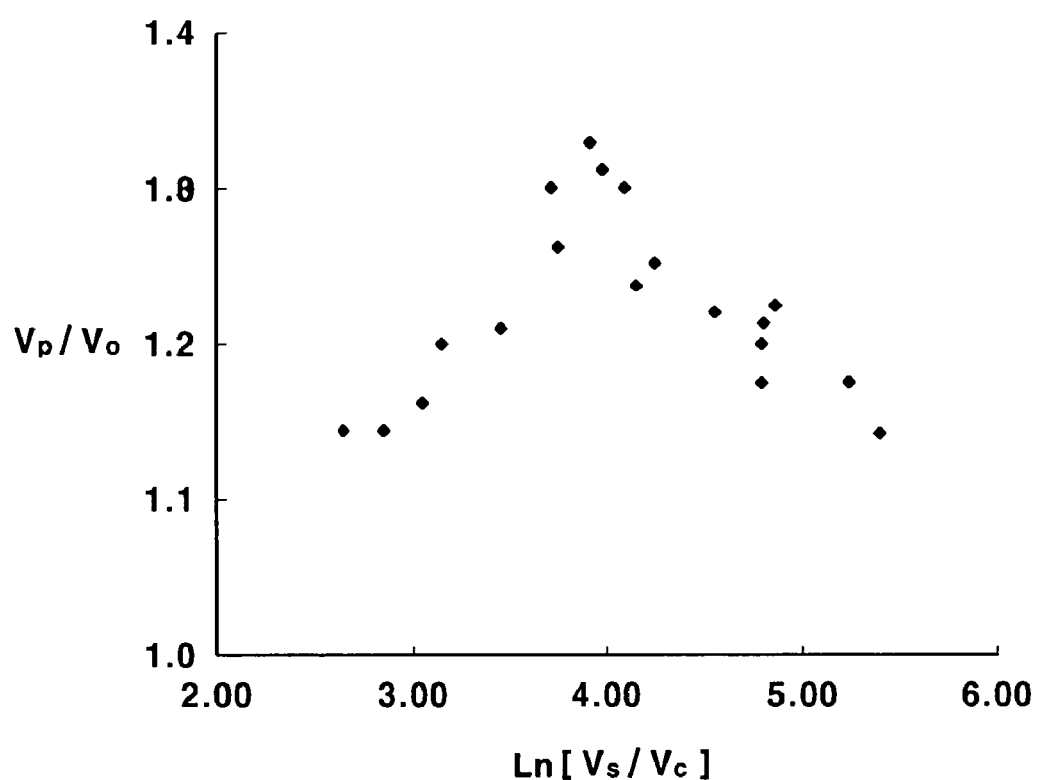

FIG. 5 is a graph for illustrating a temperature variation $\Delta Tr$ of a melt with distance from the center of a melt contained in a crucible at one fifth of the depth of the melt from the surface thereof toward the sidewall of the crucible in reference to the rotational speed of the crucible according to an embodiment of the present invention; and FIG. 6 is a graph for illustrating a growth rate of a high quality single crystal with $Ln[Vs/Vc]$ according to an embodiment of the present invention, wherein Vc represents the rotational speed of the crucible, and Vs the rotational speed of a silicon single crystal.

DETAILED DESCRIPTION OF THE PREFERRED EMBODIMENTS

The present invention is based on the fact that there exists a more critical factor contributing to the growth of a high quality single crystal with significantly reduced point defects in addition to controlling the temperature gradient of a solid-phase single crystal and the form of the solid-liquid interface. According to the present invention, in order to overcome the limitation of the solid-phase reactions such as the diffusion of point defects occurring subsequently to the crystallization is exhaustively analyzed the fluid state of the liquid-phase before being solidified, from which it has been firstly discovered that the temperature distribution of the melt is one of the most important factors.

Generally, the mechanism of the crystal growth includes growth units such as atoms or molecules moving towards and attached to crystal growth interface or metastable region. In this case, the driving force to move the growth units towards the crystal growth interface or the metastable region of the melt increases with the temperature gradient in the melt. The term "crystal growth interface" is defined as the interface between the melt and the single crystal, and the term "metastable region" as a region where the melt is in the state immediately before crystallization. Hence, if the temperature gradient in the melt becomes great, the number of the growth units participating in the crystal growing also becomes great, so that the vacancies or interstials generated in the crystal lattice are more restrained, thereby significantly increasing the growth rate of a high quality single crystal. The lattice or crystal defects to be restrained includes all the dislocation defects in the form of edge, screw, loop, etc., and stacking faults, voids of vacancy agglomerates, all resulting from vacancies and interstitials.

Figure 1:
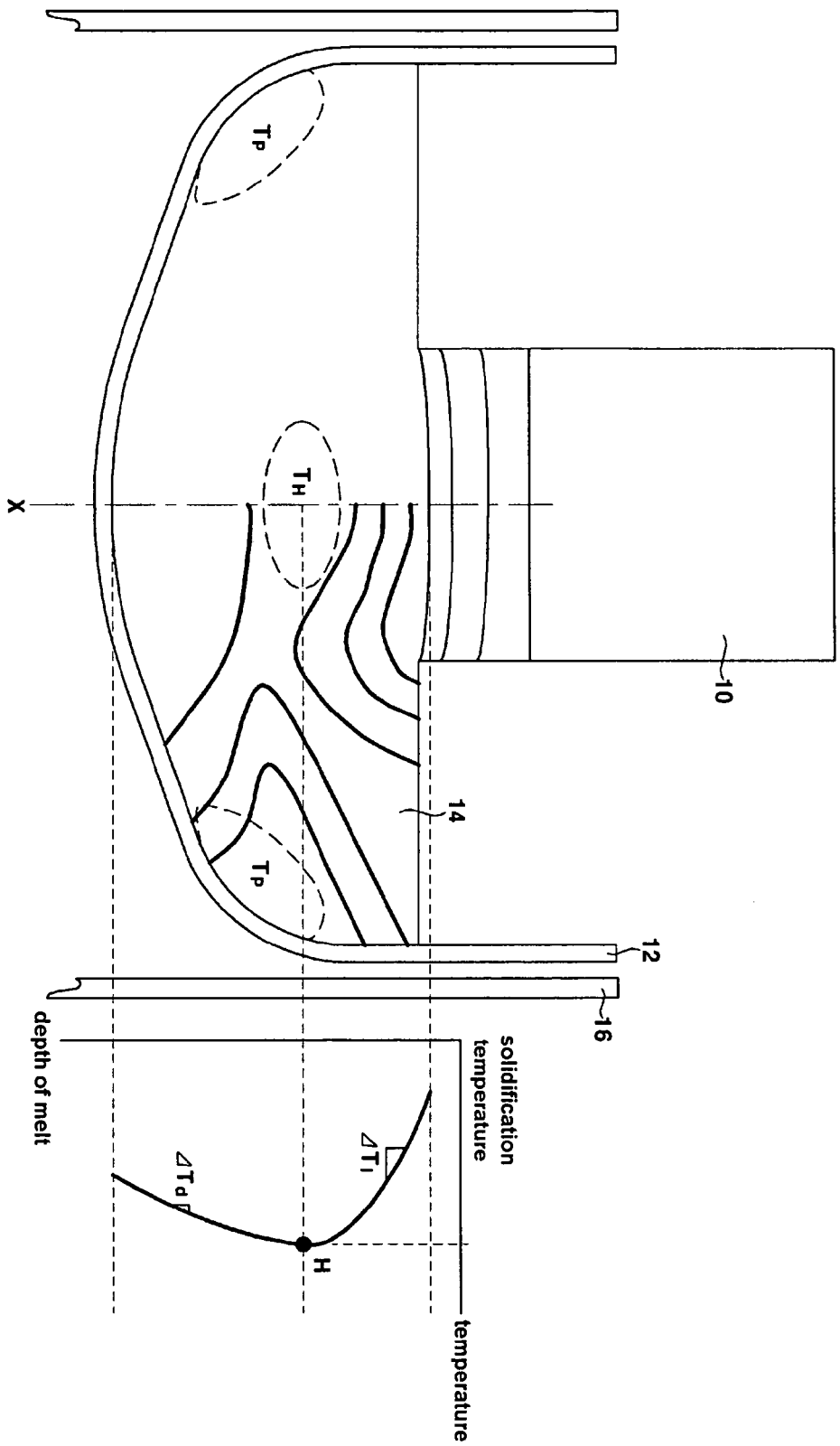
FIG. 1 is a cross-sectional view of an apparatus for showing the procedure of growing a single crystal according to an embodiment of the present invention.

Referring to FIG. 1, a solid-phase single crystal 10 is grown from a melt 14 contained in a crucible 12. Isothermal lines are shown in the melt 14, and on its outside the temperature profile of the melt as measured along an axis X parallel to the lengthwise direction of the single crystal. The temperature of the melt 14 is observed highest in the regions $T_p$ near to the sidewall of the crucible, and lowest in the solid-liquid interface where the crystal growth occurs at the solidification temperature. The temperature gradient of the silicon melt is measured along an axis parallel to the radial direction of the single crystal preferably below the single crystal, representing a vertical instantaneous temperature gradient.

According to the present invention, it has been designed to bring about a higher temperature region $T_H$ in the region around the central vertical axis of the melt than the other regions, and especially to control the temperature gradients of the upper and lower portion of the higher temperature region $T_H$. More specifically describing, the temperature of the melt is increased gradually to a maximum point H and then decreased gradually along the vertical axis parallel to the lengthwise direction of the single crystal from the interface of the single crystal and the melt to the bottom of the crucible. In this case, it is important to grow a single crystal in such a condition that the increasing temperature between the solid-liquid interface and the maximum point H is kept to have a greater temperature gradient $\Delta Ti$ than the decreasing temperature $\Delta Td$ between the maximum point H and the bottom of the crucible, i.e., $\Delta Ti>\Delta Td$. Preferably, the vertical axis is set to pass through the center of the single crystal.

The position of the higher temperature and the temperature gradient in the melt can be controlled by means of the thermal distribution of a heating apparatus, heat insulating material surrounding the melt, the rotational speeds of the single crystal and the crucible, the rate of Ar gas flowing into the single crystal growing apparatus, magnetic field, or electromagnetic field, etc. By using these various means, when the temperature gradient was optimized so as to be $\Delta Ti>\Delta Td$, a high quality single crystal devoid of various crystal defects was obtained with a significantly increased growth rate. This is caused by the driving force to move the growth units such as atoms or molecules towards the crystal growth interface that is increased by increasing the temperature gradient increasing to the maximum point, so that the vacancies or interstials generated in the crystal lattice are significantly restrained, thereby significantly increasing the growth rate of a high quality single crystal or its pulling rate. Thus, the lattice or crystal defects are restrained including all the dislocation defects in the form of edge, screw, loop, etc., and stacking faults, all resulting from vacancies and interstitials, by suppressing the generation of point defects such as vacancy and interstitial.

Meanwhile, there exist generally two kinds of convection in the melt. Namely, one occurs in the outer region, moving along the bottom and the sidewall of the crucible 10 towards the surface of the melt and then towards the single crystal, and the other in the inner region, moving along the inner sloping surface of the peripheral regions in the region near to the bottom of the single crystal. According to the present invention, the crystal growing is performed with the inner region convection maintained smaller than the outer region convection to make more uniform the quality of a single crystal (Korean Patent Application No. 2003-008098).

The inventive method of growing a single crystal may be applied to any process for growing a single crystal from a melt such as Czochralski method, modified Czochralski method, top-seed solution growth method, floating zone method, or Bridgman method. The single crystal may be a single element such as Si and Ge, or a compound such as GaAs, Inp, LN($LiNbO_3$), LT($LiTaO_3$), YAG(Yttrium Aluminum Garnet), LBO($LiB_3O_5$), and CLBO($CsLiB_6O_{10}$).

Figure 2:
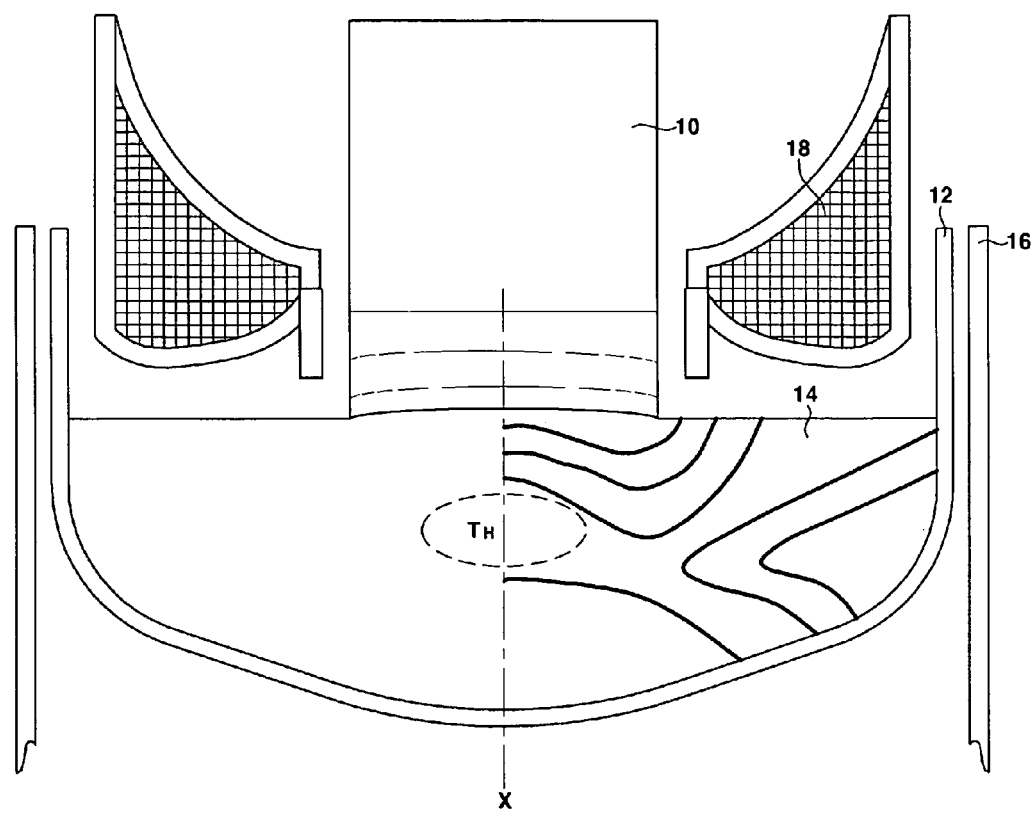
FIG. 2 is a cross-sectional view of an apparatus used for growing a single crystal according to an embodiment of the present invention.

Describing more specifically the present invention, Example 1 is obtained by using a crystal growing apparatus as shown in FIG. 2, which is equipped with a heat shield 18 to control the temperature gradient of a single crystal 10 being grown. In Example 1, an improved heater 16 is used for making the temperature gradients of the melt have such values as proposed by the present invention. Mounted laterally of the melt, the heater 16 is designed to increase the thermal quantities generated towards the regions at ⅕ to ⅔ depths of the melt from its surface compared to the other regions during the crystal growing. More preferably, the heater 16 is operated to increase the thermal quantities generated towards the regions at ⅓ to ½ depths of the melt from its surface compared to the other regions. For example, in the case of using a resistance heater, the parts of the heater directed towards the regions at ⅓ to ½ depths of the melt from its surface are designed to have higher resistance than the other parts.

The temperatures of the solid-phase single crystal 10 and the melt 14 contained in the crucible 12 were measured by using a thermocouple, shown in Tables 1 and 2. Table 1 shows temperature gradient G, temperature differences between the solid-liquid interface and the regions of the single crystal at 50 mm and 100 mm upwards from the interface, which are respectively $\Delta T(50 \text{ mm}) = 1410° \text{ C.} - T_{50 \text{ mm}}$ and $\Delta T(100 \text{ mm}) = 1410° \text{ C.} - T_{100 \text{ mm}}$. These values were expressed as the ratios compared to reference values.

Table 2 shows the temperature differences ΔT between the interface (1410° C.) and various depths of the melt, respectively ⅕, ¼, ⅓, ½, ⅔, ¾, and ⅘ depths from the surface of the melt. These values were expressed as the ratios compared to reference values. For example, the item 'melt ΔT(⅕ depth)' represents the ratio of the difference between the temperature 1410° C. of the interface and that of ⅕ depth from the interface to reference value LT⅕.

Namely, the values shown in Tables 1 and 2 are the ratios of the results of Examples 1 and 2 and comparing Examples 1 and 2 to reference values. In this case, the reference values represent a temperature profile that the temperature of the silicon melt continuously increases from the interface to the bottom of the crucible with the increasing temperature gradient being gradually reduced.

TABLE 1

| Growth Condition | Temperature Gradient at Solid-Liquid Interface (G) | Crystal Δ (50 mm) | Crystal Δ(100 mm) |
|---|---|---|---|
| Reference Value | G0 | ST50 | ST100 |
| Example 1 | 2.15 | 2.00 | 1.96 |
| Example 2 | 2.16 | 2.02 | 1.97 |
| Comparing Example 1 | 2.04 | 1.96 | 1.92 |
| Comparing Example 1 | 2.13 | 2.08 | 2.04 | tional speed of the crucible, flow rate of Ar introduced into the apparatus, and atmospheric pressure, etc. The same method as in Example 1 was used to measure the temperatures of the solid-phase single crystal and the melt, of which the results are shown in Table 2.

Comparing Example 1 was performed to grow a single crystal by using the conventional technology for controlling the temperature distribution of the solid-phase single crystal, and the same method as in Example 1 was used to measure the temperatures of the solid-phase crystal and the melt, of which the results are shown in Table 2. Comparing Example 2 was performed to grow a single crystal by using the conventional technology for controlling the solid-liquid interface to be convex towards the single crystal, and the same method as in Example 2 was used to measure the temperatures of the solid-phase crystal and the melt, of which the results are shown in Table 2.

As shown in Table 2, the temperatures of the melt in comparing Example 1 and 2 did not meet the condition proposed by the invention. Namely, in these comparing Examples, the temperature of the melt continuously increased from the solid-liquid interface to the bottom of the crucible. Evaluating the quality of the single crystal obtained according to the invention, the growth rate of Example 1 was improved by 20% compared to comparing Example 1, and that of Example 2 by 40.4% compared to Example 1.

Figure 3A:
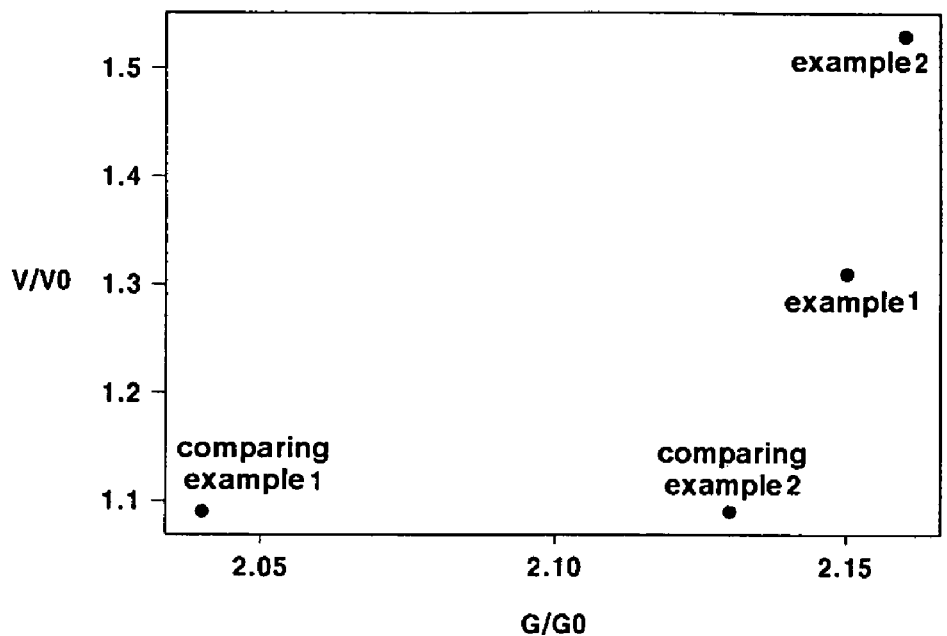
FIGS. 3a to 3c illustrate graphically the relationship between the crystal growth rate at which a high quality single crystal is obtained and the temperature gradient of the single crystal in connection with Examples 1 and 2 according to the present invention and comparing Examples 1 and 2 according to a conventional technology.

FIGS. 3*a* to 3*c* and 4*a* to 4*d* are graphs for illustrating the relationships between the growth rate V/V0 and the temperature or temperature gradient at which a high quality single crystal is obtained from the results of Tables 1 and 2 for Examples 1 and 2 and comparing Examples 1 and 2. The temperature gradient in FIG. 3*a* represents the instantaneous value G/G0 near the solid-liquid interface, and the temperature differences in FIGS. 3*b* and 3*c* respectively represent the temperature ratios $\Delta T_{s50}/\Delta T0$ and $\Delta T_{s100}/\Delta T0$ of the single crystal to the solid-liquid interface at heights of 50 mm and 100 mm from the solid-liquid interface.

Meanwhile, FIGS. 4*a* to 4*d* respectively represent the temperature ratios $\Delta T_{15}/\Delta T0$, $\Delta T_{14}/\Delta T0$, $T_{13}/\Delta T0$ and $T_{12}/\Delta T0$

TABLE 2

| Growth Condition | Melt ΔT (⅕ Depth) | Melt ΔT (¼ Depth) | Melt ΔT (⅓ Depth) | Melt ΔT (½ Depth) | Melt ΔT (⅔ Depth) | Melt ΔT (¾ Depth) | Melt ΔT (⅘ Depth) | High Quality Growth Rate (V) |
|---|---|---|---|---|---|---|---|---|
| Reference | LT1/5 | LT1/4 | LT1/3 | LT1/2 | LT2/3 | LT3/4 | LT4/5 | V0 |
| Example 1 | 1.30 | 1.31 | 1.31 | 1.30 | 1.13 | 1.05 | 0.96 | 1.31 |
| Example 2 | 1.54 | 1.53 | 1.54 | 1.53 | 1.21 | 1.07 | 0.95 | 1.53 |
| Compararing Example 1 | 1.09 | 1.08 | 1.08 | 1.08 | 1.09 | 1.10 | 1.10 | 1.09 |
| Comparing Example 2 | 1.10 | 1.09 | 1.10 | 1.10 | 1.13 | 1.15 | 1.15 | 1.09 |

As shown in FIG. 2, Example 1 shows that the temperature of the melt gradually increased from the interface to the maximum point below ½ depth with a value of 1.3 times the reference value at ⅕ depth, and thereafter gradually decreased from the maximum point towards the bottom of the crucible with the same value as the reference at a region between ¾ and ⅘ depth and a lower value than the reference below ⅘ depth. In this case, the increasing temperature gradient was greater than that of the decreasing temperature gradient. A silicon single crystal was obtained under the temperature condition as described above.

Example 2 was performed by using the same crystal growing apparatus as in Example 1 with varying the process parameters such as rotational speed of a single crystal, rotaof the melt to the solid-liquid interface at ⅕, ¼, ⅓ and ½ depths from the solid-liquid interface.

Figure 3B:
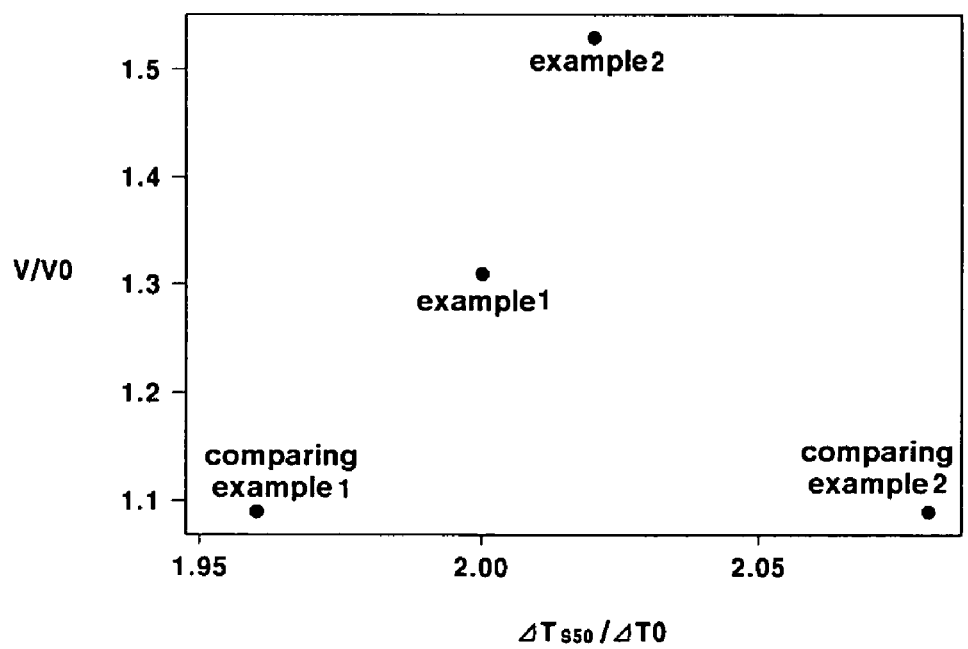
Figure 3C:
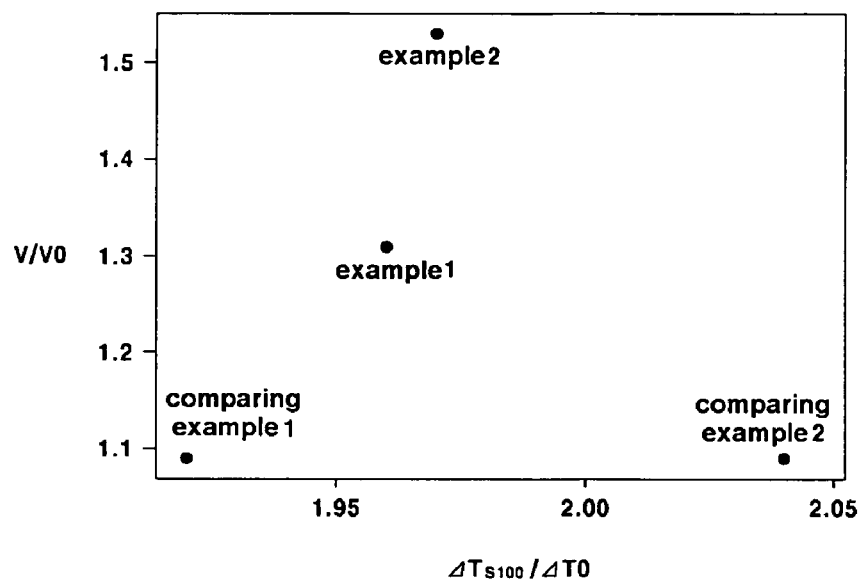
Figure 4A:
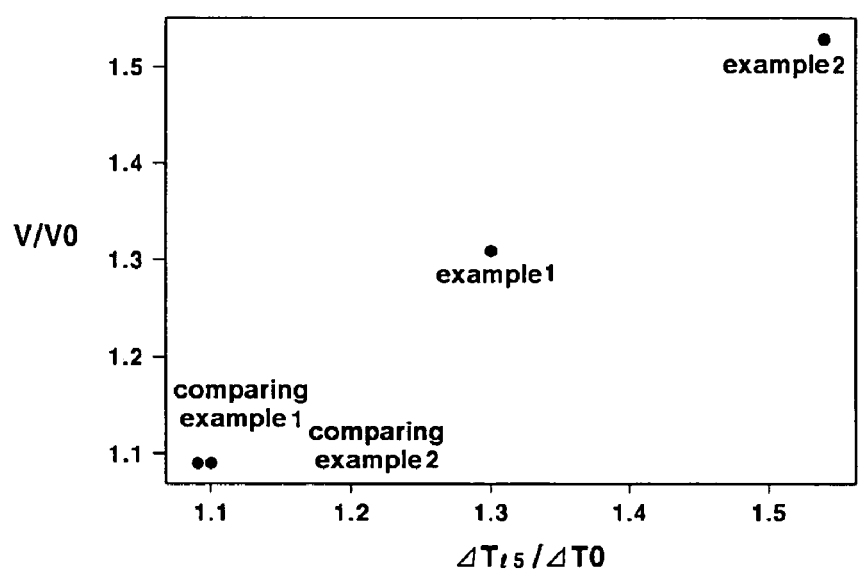
FIGS. 4a to 4d illustrate graphically the relationship between the crystal growth rate at which a high quality single crystal is obtained and the temperature gradient of a melt in connection with Examples 1 and 2 according to the present invention and comparing Examples 1 and 2 according to a conventional technology.
Figure 4B:
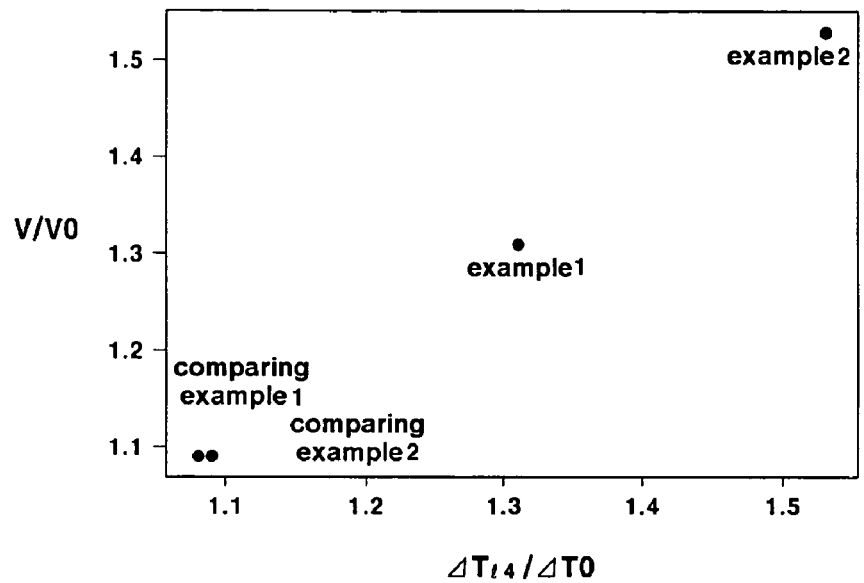
Figure 4C:
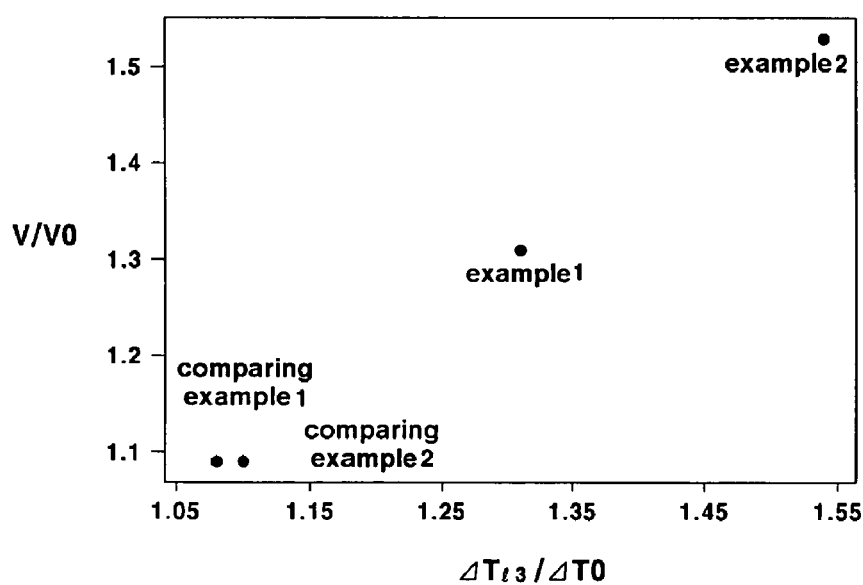
Figure 4D:
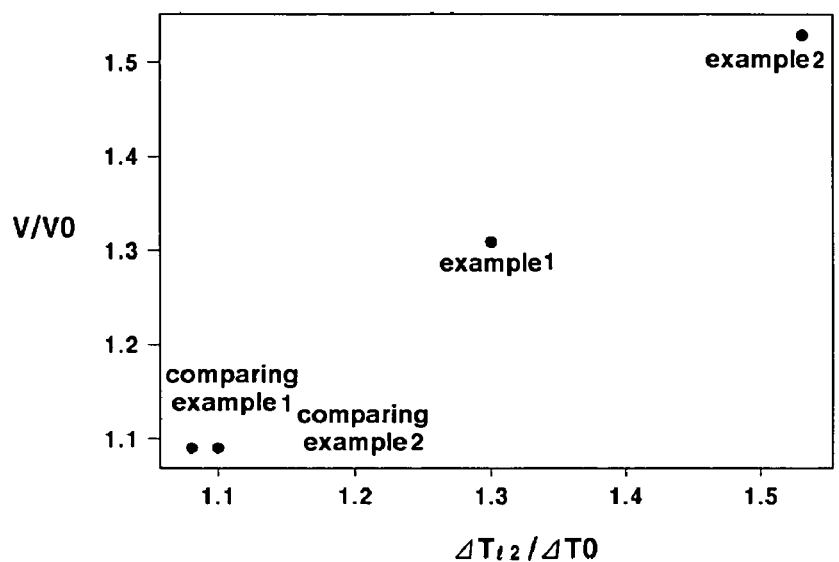

Referring to FIGS. 3*a* to 3*c*, V/G does not show uniform values, and therefore it is noted that the growth rate of a high quality single crystal does not depend on its temperature gradient or temperature difference. However, referring to FIGS. 4*a* to 4*d*, it is noted that the growth rate of a high quality single crystal is significantly affected by the temperature difference or the gradient thereof, which means that the temperature gradient of the melt is a crucial factor to grow a high quality single crystal. In addition, it has been observed that the growth rate of a high quality single crystal was considerably improved in Examples 1 and 2 compared to comparing Examples 1 and 2.

Besides, observing that the temperature distribution of the melt along the radial direction of the single crystal is dependent on the rotating speed of the crucible 20, the rotating speed was optimized in order to make the temperature distribution uniform. The rotation of the crucible causes the melt to undergo a centrifugal force $F=mr\omega^2$ per unit volume, wherein m is the mass of the unit volume, r the distance from the central axis of the crucible, and $\omega$ the angular speed of the unit volume regarded as equal to the rotating speed of the crucible. The other forces such as frictional force except for the centrifugal force are not considered.

FIG. 5 shows a graph for illustrating the temperature difference $\Delta Tr$ of the silicon melt according to the an embodiment of the present invention that varies with the rotating speed of the crucible along the radial direction from the center of the crucible at ⅕ depth from the surface of the melt. As the rotating speed of the crucible decreases, i.e., down from curve $\omega_3$ toward curve $\omega_1$, the temperature difference $\Delta Tr$ is reduced, thus resulting in making the temperature distribution of the melt uniform in the radial direction. Hence, in order to make the temperature of the silicon melt uniform in the radial direction of the single crystal, the rotating speed of the crucible must have a lower value, e.g., below 2 rpm, preferably 1 rpm, or more preferably 0.6 rpm. The centrifugal force F exerted to the melt increases linearly with the distance from the rotational axis along the radial direction of the single crystal, and with the rotating speed of the crucible squared.

Further, in order to increase the productivity of a high quality single crystal, the range of the rotating speed of the single crystal must be determined considering the rotating speed of the crucible 20. FIG. 6 illustrates the growth rate of a single crystal against natural logarithm Ln[VsVc], wherein Vc is the rotating speed of the crucible and Vs that of the single crystal, according to an embodiment of the present invention. In FIG. 6, Vp represents the growth rate of a high quality single crystal according to the present invention, and Vo according to the conventional technology.

Referring to FIG. 6, the growth rate increases with the value of Ln[Vs/Vc] to a certain point, from which it decreases with the value of Ln[Vs/Vc]. This means that if the rotating speed of the single crystal becomes too high compared to the lower rotating speed of the crucible speed, the colder portion of the melt at the bottom of the crucible rises upward so as to decrease the temperature of the hot region at the upper part of the melt, and thus the temperature gradient of the melt along the vertical direction. Moreover, when determining the value of Ln[Vs/Vc], if the temperature gradient of the melt along the radial direction of the single crystal becomes too low near the triple point of single crystal (solid)—melt (liquid)—atmosphere (gas), an abnormal growth of the crystal may occur, and therefore such value should be preferably avoided. Accordingly, in the invention, the condition for the growth of a high quality single crystal has been determined to meet the following Formula 1, wherein Vc is the rotating speed of the crucible, and Vs that of the single crystal:

$$3 \leq Ln[Vs/Vc] \leq 5 \qquad \text{Formula 1}$$

As described above, because the present invention is based on the liquid phenomena and not on the solid phenomena, the interstitial and the vacancy dominant regions do not usually appear symmetrically around the central longitudinal axis of the single crystal, but there is no problem in obtaining high quality single crystals and wafers thereof. Accordingly, the single crystal and wafer have a quality distribution such as defect concentration appearing substantially asymmetrical around the center.

It will be apparent to those skilled in the art that the invention may be applied to all kinds of single crystal growing including Czochralski method, and modified to give various embodiments without departing from the gist of the present invention.

What is claimed is:

1. A method of growing a single crystal from a melt contained in a crucible, comprising the step of making the temperature of said melt increase gradually to a maximum point and then decrease gradually along the axis parallel to the lengthwise direction of said single crystal from the interface of said single crystal and said melt to the bottom of said crucible, wherein the increasing temperature of said melt is kept to have a greater temperature gradient than the decreasing temperature thereof.

2. A method of growing a single crystal as defined in claim 1, wherein the temperature gradient is an instantaneous axial temperature gradient.

3. A method of growing a single crystal as defined in claim 1, wherein said axis is set to pass through the center of said single crystal.

4. A method of growing a single crystal as defined in claim 1, wherein said maximum point is designed to be in a region between one fifth of the depth of said melt from the surface thereof and two thirds of said depth.

5. A method of growing a single crystal as defined in claim 1, wherein said maximum point is designed to be in a region between one third of the depth of said melt from the surface thereof and a half of said depth.

6. A method of growing a single crystal as defined in claim 1, wherein the rotating speed Vc of said crucible and the rotating speed Vs of said single crystal satisfies the following formula:

$$3 \leq Ln[Vs/Vc] \leq 5.$$

7. A method of growing a single crystal as defined in claim 1, including a further step of applying more heat to a region between one fifth of the depth of said melt from the surface thereof and two thirds of said depth than the other regions by a heating apparatus arranged laterally of said melt.

8. A method of growing a single crystal as defined in claim 1, including a further step of applying more heat to a region between one third of the depth of said melt from the surface thereof and a half of said depth than the other regions by a heating apparatus arranged laterally of said melt.

9. A method of growing a single crystal as defined in claim 1, including a further step of making the convection of the inner region of said melt smaller than that of the outer region thereof.

10. A method of growing a single crystal as defined in claim 1, wherein said method of growing a single crystal is one of the Czochralski method, modified Czochralski method, top-seeded solution growth method, floating zone method, and Bridgman method.

11. A method of growing a single crystal as defined in claim 1, wherein said single crystal comprises a single element like Si or Ge, or a compound like GaAs, InP, LN($LiNbO_3$), LT($LiTaO_3$), YAG(yttrium aluminum garnet), LBO($LiB_3O_5$), or CLBO($CsLiB_6O_{10}$).

* * * * *